(12) United States Patent
Meszlenyi

(10) Patent No.: US 6,320,460 B1
(45) Date of Patent: Nov. 20, 2001

(54) CLASS D AMPLIFIER

(76) Inventor: Ivan Meszlenyi, 8 Sand Beach Road Apt. 23, Etobicoke, Ontario (CA), M8V 2W3

( * ) Notice: Subject to any disclaimer, the term of this patent is extended or adjusted under 35 U.S.C. 154(b) by 0 days.

(21) Appl. No.: 09/580,417

(22) Filed: May 30, 2000

(51) Int. Cl.[7] .............................. H03F 3/38; H03F 21/00; H03F 3/217

(52) U.S. Cl. ..................... 330/10; 330/207 A; 330/251

(58) Field of Search ................................ 330/10, 207 A, 330/251

(56) References Cited

U.S. PATENT DOCUMENTS

| | | | |
|---|---|---|---|
| 4,531,096 | * | 7/1985 | Yokoyama .............................. 330/10 |
| 5,838,193 | * | 11/1998 | Myers et al. .......................... 330/251 |
| 6,072,361 | * | 6/2000 | Myers et al. ............................. 330/10 |

\* cited by examiner

Primary Examiner—Robert Pascal
Assistant Examiner—Patricia T. Nguyen

(57) ABSTRACT

A Class D amplifier having a low-level audio signal feeding the negative input of an Integrator via an input resistor. Said Integrator feeds a Comparator having well-defined Hysterisis. Said Comparator output is connected to a First Level Shifter in order to convert a ground-referenced signal to a negative-voltage-rail-referenced signal so as to provide a drive signal for a First Switching Device which is connected to a Negative Rail Voltage (Vminus) and an Output, where said Output is defined as the junction of said First and a Second Switching Device and said junction having a time averaged signal of high power capable of driving a low impedance load such as a loudspeaker. A Second Level Shifter is provided so as to drive said Second Switching Device which is connected to the Positive Rail Voltage (Vplus) and said Output. The signal from said Second Level Shifter is floating and referenced to said Output. The signal at said Output is kept in phase with the signal of said Second Level Shifter, yielding very high $\Delta v/\Delta t$ immunity at said Output. A Feedback Resistor is provided from said Output to the negative input of said Integrator in order to ensure self-oscillation and to provide negative feedback in order to reduce distortion and the effective output impedance (increasing the damping factor). A Low-Pass filter between said Output and said Load is desirable to reduce unwanted RF and switching noise.

12 Claims, 4 Drawing Sheets

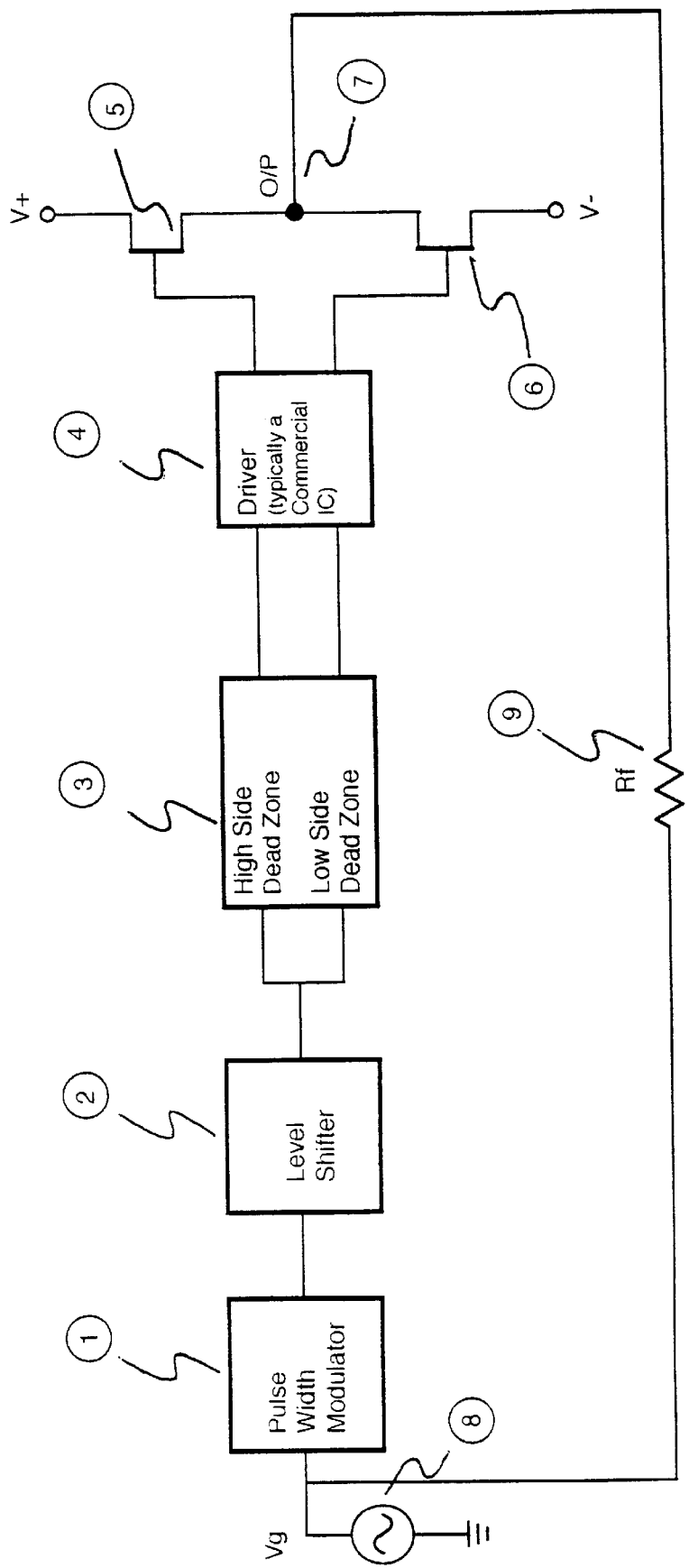
Fig.:1 Prior Art

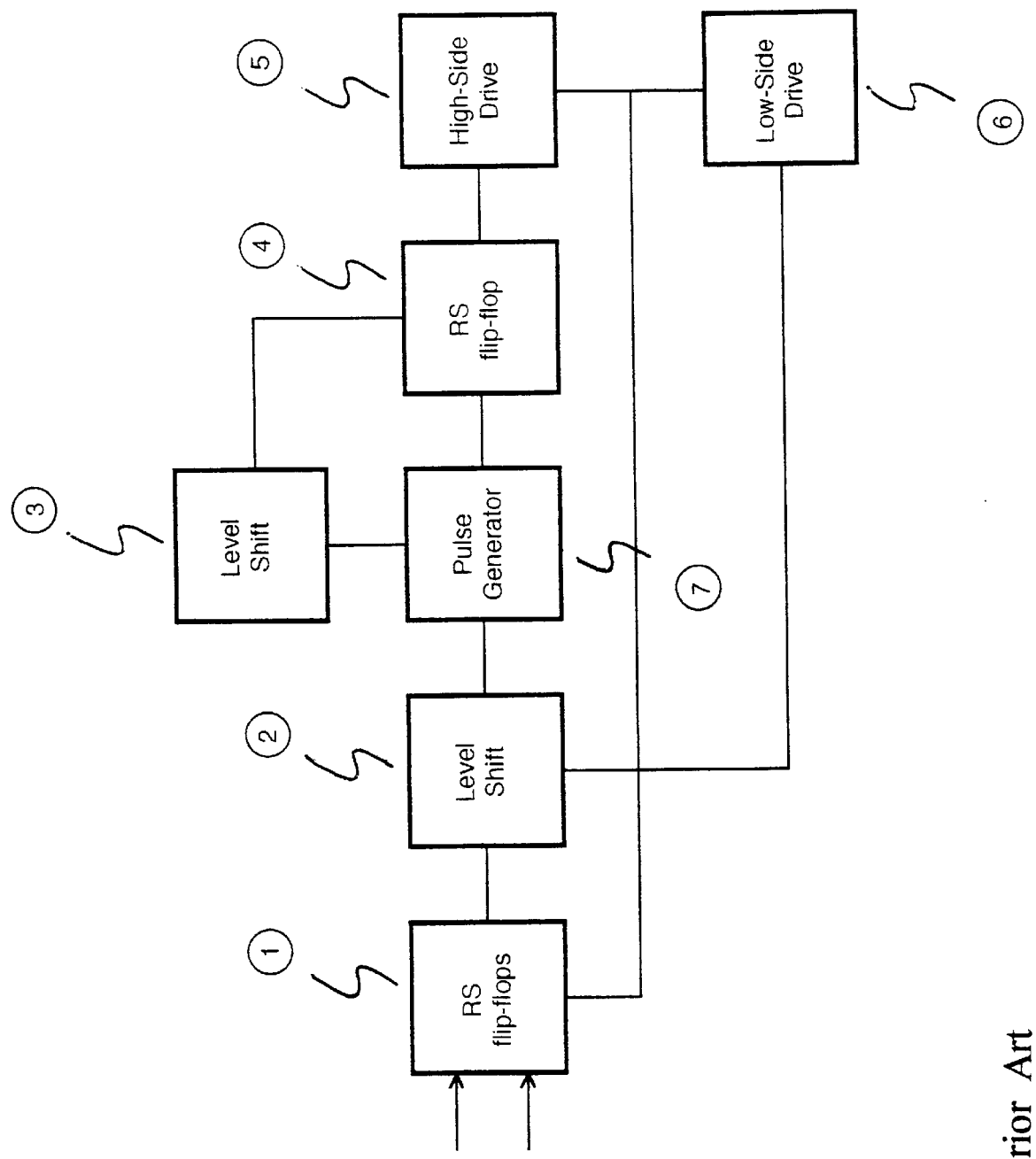
Fig.:2 Prior Art

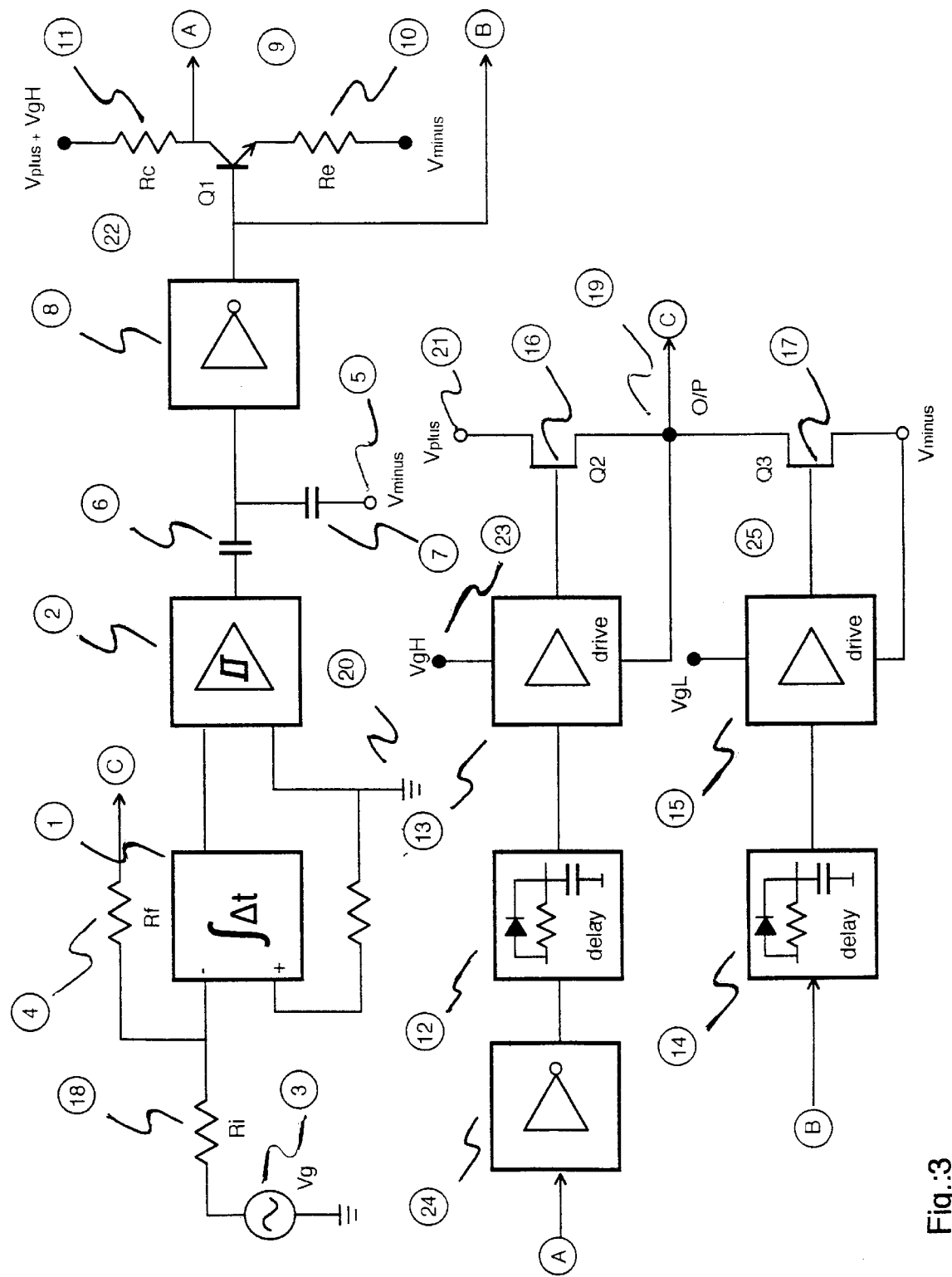
Fig.:3

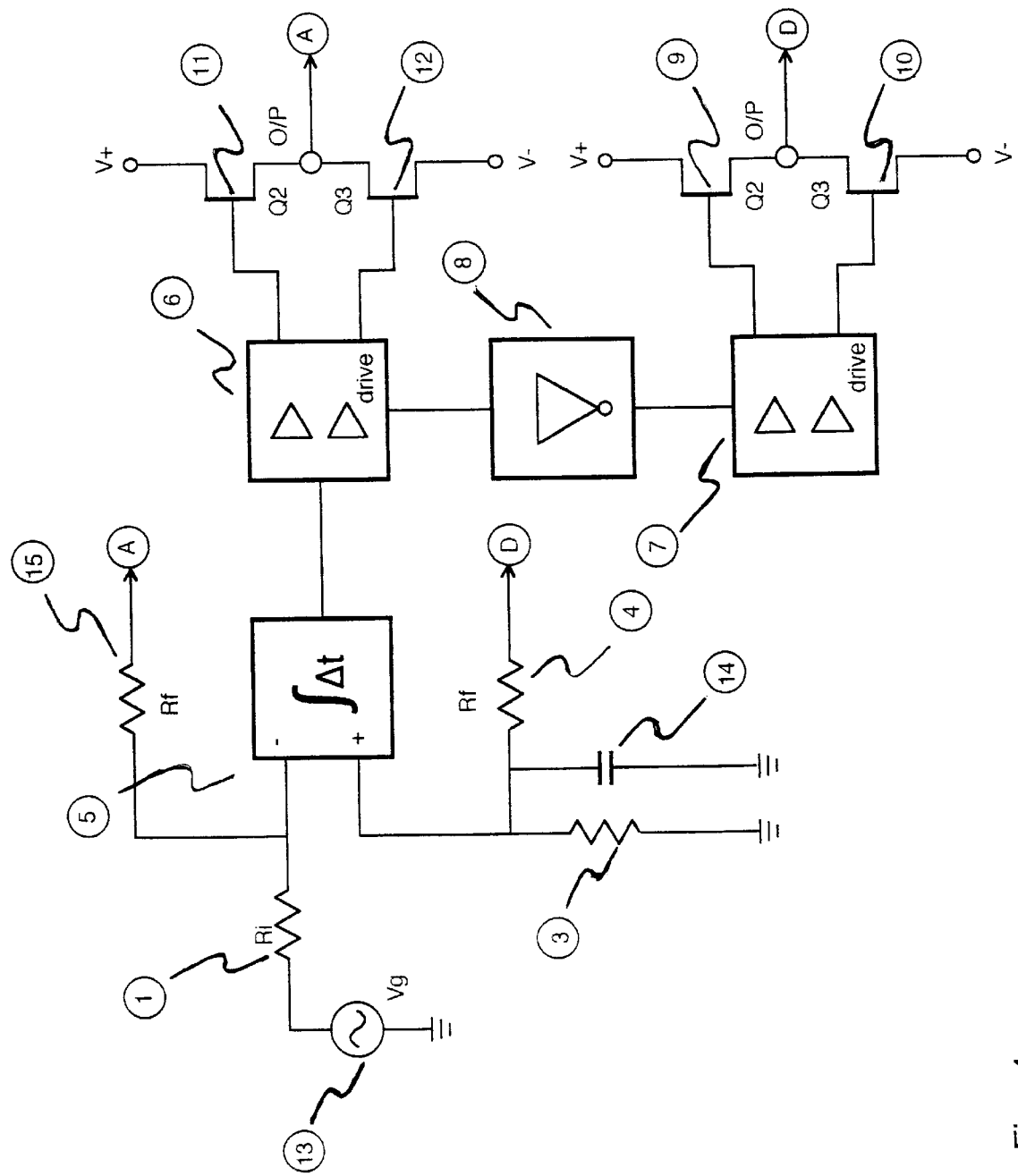
Fig.: 4

CLASS D AMPLIFIER

FIELD OF THE INVENTION

The present invention is related in general to high efficiency power amplification. In particular, it is related to the Class D type switching amplifier wherein voltage and current stresses are never simultaneously present, yielding efficiencies in the 90%+region. The present invention achieves this objective with the minimum number of inexpensive "off the shelf" components while maintaining a high degree of functionality and reliability.

BACKGROUND OF THE INVENTION

In the prior art as depicted in FIG. 1, the low level audio signal (8) is injected into the input of a Pulse Width Modulator (1) having a signal which is referenced to ground. Said signal is then referenced to a negative voltage rail with the aid of Level Shifter (2). The negative rail referenced, pulse width modulated signal is typically fed to Driver (4) with the aid of High Side and Low Side Dead Zone (3) processing circuitry in order to avoid the simultaneous conduction of Output Switching Devices (6) and (7). Customarily a Feedback Resistor (9) is employed between Output (7) and the Pulse Width Modulator (1) in order to reduce non-linearities.

FIG. 2 depicts the typical circuitry within Driver (FIG. 1(4)). In the prior art depicted in FIG. 2, the Low and High Side Logic Level signals are fed to a pair of R/S Flip-Flops (1). The Signal Output of said R/S Flip-Flops is then fed to Level Shifter (2) in order to obtain a drive signal for the high current output Low Side Drive (6).

The High Side high current Driver (5) is driven by R/S Flip-Flop (4). The input to said R/S Flip-Flop (4) is also driven by another Level Shifter (3) to obtain a floating High Side signal. Pulse Generator (7) is introduced between Level Shifter (2) and Level Shifter (3) to ensure noise immunity and freedom from false triggering.

Level Shifter (3) is the most critical in high voltage, high frequency applications. The simultaneous presence of high voltage and high frequency requirements will introduce a thermal component in addition to that produced by the High Side Driver (5) and Low Side Driver (6). The two thermal components can be computed as $CV^2F$. Said two thermal components will limit the Power-Frequency product to approximately 125,000 WkHz.

The present invention exhibits a constant thermal component in respect to frequency, total freedom from false triggering, and a Power-Frequency product of 125,000 WkHz.

In its most common form, the functionality described above is implemented in a commercially available high density Integrated Circuit. FIG. 2 and the above description shows the large number of signal processing stages that said Pulse Width Modulated signal obtained at the output of the High Side and Low Side Dead Zone processing circuitry (FIG. 1 (3)) has to undergo.

The large number of said signal processing stages depicted in Driver (4) result in propagation delays in excess of the 100 nS range. For a Class D amplifier of relatively high power, say 200W into 8Ω, a 100 kHz switching frequency can not be exceeded without impairing reliability. However, a 100 kHz switching frequency yields unacceptably high distortion in the higher registers of the audio band. A further limiting factor is the maximum $\Delta v/\Delta t$ that can be obtained at the Output (7) without causing false triggering. A false triggering condition can lead to destruction of the Output Switching Devices (5) and (6).

The present invention overcomes the complexity and high cost of the prior solution by achieving the same functionality using discrete, inexpensive, "off-the-shelf" components while simultaneously increasing the flexibility of the resulting circuits, allowing the same topology to satisfy requirements from 50WRMS to over 100WRMS. Most importantly, the present invention allows higher switching speeds while improving reliability through superior $\Delta v/\Delta t$ immunity. Typically, one may obtain a switching speed with no loss of reliability up to 5 MHz at 40V and 500 kHz at 200V.

Matching the propagation delays of the High Side and Low Side Drives is not a critical issue in the present invention as these are readily adjusted by appropriately choosing the component values of the Asymmetrical Delay Networks.

BRIEF DESCRIPTION OF THE DRAWINGS

The present invention will now be described, by way of example only, with reference to the following drawings in which:

FIG. 1 is a schematic diagram of the components of a prior art Class D amplifier;

FIG. 2 is a schematic diagram of the circuit layout of a driver of the Class D amplifier of FIG. 1;

FIG. 3 shows in diagrammatic form the circuit layout of a Class D amplifier made in accordance with the preferred embodiment of the present invention; and FIG. 4 shows in diagrammatic form the circuit layout of a full bridge Class D amplifier made in accordance with an alternate embodiment of the present invention.

DETAILED DESCRIPTION OF THE PREFERRED EMBODIMENT

FIG. 3 shows the preferred embodiment of a Class D amplifier utilizing the present invention. Signal Generator (3) is fed to the negative input of Integrator (1) through Input Resistor (18). A Feedback Resistor (4) is also connected from the Output (19) to said negative input. The signal from Integrator (1) is an input for the Comparator (2) that has a Hysterisis which can be used to set the frequency of self-oscillation of the Class D amplifier. The signal at the output of Comparator (2) is referenced to Ground (20) and is therefore not suitable to drive directly the output devices Q2 (16) and Q3 (17).

To obtain a Negative Rail Voltage (5) referenced signal a capacitive level shifter is utilized consisting of Capacitor (6) and Capacitor (7) that are connected in series. Capacitor (7) is connected to Vminus (5) and the other side, which is the junction of the two capacitors, is fed to First Buffer (8). The other side of Capacitor (6) is connected to the Comparator (2) output. The output of said First Buffer (8) is connected to Transistor (9) base. The emitter of said Transistor (9) is connected to Vminus(5) through an Emitter Resistor (10) so as to produce a switched current source. The collector of said Transistor (10) is connected to the Positive Rail Voltage (5) incremented by gate supply voltage, Vplus+VgH (22), through a Collector Resistor (11). The signal appearing at the collector of Transistor (9) will float with the output signal. This is then fed to Second Buffer (24) driving a First Asymmetrical Delay Network (12) which is then fed to input of Mosfet Driver (13). The output obtained at Mosfet Driver (13) thus will have sufficient current driving capabilities for Switching Device (16). Similarly the signal generated at the output of Buffer (8) is fed to the input of Second Asymmetrical Delay Network (14) and the output of said Second Asymmetrical Delay Network (14) is fed to the Mosfet Driver (15) which also has high current switching capability.

The timing of the switching sequence is set by First and Second Asymmetrical Delay Networks (12) and (14) and will insure that no cross-conduction will take place between Output Switching Devices (16) and (17). The signal gain will be defined by the ratio of the values of said Feedback Resistor (4) and said Input Resistor (18).

FIG. 4 shows an alternative embodiment for which the present art is particularly well suited. Class D amplifiers offer the greatest advantage for high power applications, where their efficiency can translate into cost savings in power supply and heat sink components. Therefore a Full Bridge configuration is highly desirable. However, in such a configuration, in order to remove non-linearities, a feedback loop would have to be incorporated which includes both output stages. Said feedback loop is readily achieved in the present invention by connecting another Feedback Resistor from the Second Output Stage to the positive input of the Integrator.

Illustrated in FIG. 4 is a Full Bridge Class D Amplifier with negative feedback around both outputs. Signal Generator (13) is connected through First Input Resistor (1) to the negative input of Integrator (5). A Second Input Resistor (3) is connected between the positive input of said Integrator (5) and ground. An integrating Capacitor (14) is connected is also connected from said positive input to the ground. The output of said Integrator is fed to Class D Drive (6). The output of said Class D Drive (6) supplies the high current required to switch the set of Output Devices (11) & (12). Another output is derived from said Class D Drive (6) which is connected to the input of Inverter (8) so as to a 180° phase shift between the output signal of the First & Second Output Stages. Class D Drive (7) has a similarly high current output to ensure rapid switching of Switching Devices (9) & (10).

Feedback Resistor (15) is connected between the negative input of Integrator (5) and the junction of Switching Devices (11) & (12). Feedback Resistor (4) is connected between the positive input of Integrator (5) and the junction of Switching Devices (9) & (10).

If Feedback Resistors (4) & (15) are chosen to be equal in value, and Input Resistors (1) & (3) are also of equal value, then the total gain is derived by the Feedback Resistance divided by the Input Resistance.

Thus, while what is shown and described herein constitutes preferred embodiments of the subject invention, it should be understood that various changes can be made without departing from the subject invention, the scope of which is defined in the appended claims.

I claim:

1. A Class D amplifier, comprising:
   a) a source of split DC voltage having a Negative Voltage Rail, a Positive Voltage Rail and a Ground;
   b) an audio signal source connected to a First Input Resistor which is connected to the negative input of an Integrator;
   c) a Comparator, having a well-defined Hysterisis, with its input connected to said Integrator's output;
   d) a First Level Shifter comprising a First and a Second Capacitor connected in series between the output of said Comparator and the negative voltage rail so as to change the Ground Referenced Output Signal of said Comparator to said Negative Voltage Rail Referenced signal;
   e) said Negative Voltage Rail Referenced Signal at the junction of said First and Second Capacitor is connected to a First Buffer, and
   f) a Second Level Shifter utilizing a Transistor in a switched current source configuration wherein the signal derived from the collector of said transistor is floating and referenced to the output and is also in phase with the output signal achieving high $\Delta v/\Delta t$ immunity;
   g) a First and a Second Asymmetrical Delay Network introducing the appropriate amount of delay in order to avoid simultaneous conduction;
   h) a Second Buffer driven by the collector of said Transistor having low output impedance in order to drive said Second Asymmetrical Delay Network;
   i) a First and a Second Output Switch driven by First and Second Driver stages that deliver high speed, high current pulses having input signals processed as described, and the junction of said First and Second Switches is capable of driving a low impedance load such as a loudspeaker; and
   j) a First Feedback Resistor is also connected between the negative input of said Integrator, and the said Output reducing non-linearities and distortion. The average value of the signal obtained at said Output will be defined as the value of said First Feedback Resistor divided by the value of the First Input Resistor times the Audio Input Signal.

2. A Class D amplifier circuit as claimed in claim 1, having an Input Resistor that is connected to an audio signal source and a Feedback Resistor connected to the negative input of an Integrator, wherein said Integrator has a Triangular waveform output signal.

3. A Class D amplifier circuit as claimed in claim 1, wherein said Comparator has a well defined Hysterisis which in turn will define the peak-to-peak value of said triangle waveform.

4. A Class D amplifier circuit as claimed in claim 1, wherein said First and said Second Capacitors of said First Level Shifter serve as a voltage divider of the pulses that are generated at the output of said Comparator and converting said pulses that are Ground Referenced to pulses that are Negative Voltage Rail Referenced.

5. A Class D amplifier circuit as claimed in claim 1, wherein said First Buffer is utilized to drive said First Asymmetrical Delay Network and said Second Level Shifter.

6. A Class D amplifier circuit as claimed in claim 1, wherein said First Asymmetrical Delay Network consists of a First Resistor, First Capacitor and is made asymmetrical by means of bypassing the First Resistor with First Switching Diode.

7. A Class D amplifier circuit as claimed in claim 1, wherein said Second Asymmetrical Delay Network consists of a Second Resistor, Second Capacitor and is made asymmetrical by means of bypassing the Second Resistor with Second Switching Diode.

8. A Class D amplifier circuit as claimed in claim 1, wherein said Second Level Shifter includes a Transistor configured as a switched current source in order to convert a Negative Voltage Rail Referenced Signal to an Output Referenced Signal.

9. A Class D amplifier circuit as claimed in claim 1, wherein said First Driver stage is utilized to deliver high speed, high current pulses to the gate of said First Output Switch which is connected to said Negative Voltage Rail and said Second Output Switch.

10. A Class D amplifier circuit as claimed in claim 1, wherein said Second Driver stage is utilized to deliver high speed high current pulses to the gate of said Second Output Switch which is connected to said Positive Voltage Rail and said First Output Switch.

11. A Class D amplifier circuit as in claim 1, wherein the positive input of said Integrator is connected to Ground via a Second Input Resistor paralleled with an Integrating Capacitor and a Second Feedback Resistor which is connected between said positive input of said Integrator and the output junction of a Third and Fourth Output Switches which are driven by an identical drive signal processing circuits as in claim 1; the Output signal is defined as that signal appearing between the junction of said First and Second Output Switches and the junction of said Third and Fourth Output Switches; said Second Input Resistor should be chosen to be equal in value to said First Input Resistor and said Second Feedback Resistor should be chosen to be equal in value to said First Feedback Resistor to ensure that the two amplifiers so connected have equivalent gain; this configuration will allow a doubling of available average power while maintaining feedback for both amplifying stages.

12. Class D amplifier circuit as in claim 11, wherein the feedback signals provided to the negative and positive inputs of said Integrator will force the duty cycle of the signal appearing at said Output to be limited to a well defined value at the extremes of modulation; this provides a highly desirable feature in that it prevents the Class D amplifier of claim 11 from operating too close to edge of modulation thus maintaining stability under all signal conditions.

* * * * *